United States Patent
Farjad-Rad et al.

(10) Patent No.: US 7,167,517 B2
(45) Date of Patent: Jan. 23, 2007

(54) ANALOG N-TAP FIR RECEIVER EQUALIZER

(75) Inventors: Ramin Farjad-Rad, Mountain View, CA (US); Thomas H. Lee, Burlingame, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 895 days.

(21) Appl. No.: 09/863,081

(22) Filed: May 22, 2001

(65) Prior Publication Data

US 2001/0043649 A1    Nov. 22, 2001

Related U.S. Application Data

(60) Provisional application No. 60/206,191, filed on May 22, 2000.

(51) Int. Cl.
    *H03H 7/40* (2006.01)
(52) U.S. Cl. .................... 375/232; 375/350; 708/819

(58) Field of Classification Search ............. 375/229, 375/232–234, 316, 350; 708/313, 819; 341/61
See application file for complete search history.

(56) References Cited

U.S. PATENT DOCUMENTS 5,907,295 A * 5/1999 Lin ........................... 341/61
5,931,898 A * 8/1999 Khoury ...................... 708/819

* cited by examiner

*Primary Examiner*—Dac V. Ha
(74) *Attorney, Agent, or Firm*—Sawyer Law Group LLP (57) ABSTRACT

An equalizer includes plural samplers for sampling an incoming input data stream according to plural phases of a sampling clock, each sampler producing a data sample. Operating in the analog domain, a multi-tap finite impulse response (FIR) filter weights the data samples and combines the weighted data samples to produce a filtered data bit. The filtered data bits thus form an equalized output data stream. The equalizer can compensate for characteristics of a communications channel, such as low-pass characteristics. The channel may carry high-speed, e.g., multi-gigabit per second, traffic.

21 Claims, 5 Drawing Sheets

ANALOG N-TAP FIR RECEIVER EQUALIZER

RELATED APPLICATION

This application claims the benefit of U.S. Provisional Application No. 60/206,191, filed on May 22, 2000. The entire teachings of the above application are incorporated herein by reference.

BACKGROUND OF THE INVENTION

The performance of many digital systems is limited by the interconnection bandwidth between chips, boards, and cabinets. As VLSI technology continues to scale, system bandwidth will become an even more significant bottleneck as the number of I/Os scales more slowly than the bandwidth demands of on-chip logic. Also, off-chip signaling rates have historically scaled more slowly than on-chip clock rates. Most digital systems today use full-swing unterminated signaling methods that are unsuited for data rates over 100 MHz on one meter wires. Even good current-mode signaling methods with matched terminations and carefully controlled line and connector impedance are limited to about 1 GHz by the frequency-dependent attenuation of copper lines. Without new approaches to high-speed signaling, bandwidth will stop scaling with technology when we reach these limits.

Fully digital receiver equalizers, using finite impulse response (FIR) filters, require high-resolution sampling ADCs that run at GHz speeds, which is a challenging task in present CMOS technologies.

On the other hand, fully analog continuous-time equalizers have the disadvantage that the active equalizers need very wide-bandwidth front-end receiver circuits that run at the same speed as the input data signal, and the passive techniques attenuate the received signal amplitude resulting in large signal to noise ratio. The low Ft of transistors in present CMOS technologies makes receiver equalizer design quite challenging at multi-Gbps rates.

Input equalizers, reported to date in CMOS technology, all operate at data rates below 1.5 Gbps. See, for example, P. J. Black and T. Meng, "A 1-Gbps, four-state, sliding block Viterbi decoder," IEEE JSSC, vol. 32, no. 6, June 1994; and Kamran Iravani et al., "Clock and data recovery for 1.25 Gb/s Ethernet Transceiver in 0.35-mm CMOS," IEEE Custom Integrated Circuits Conference, page 261, May 1998.

SUMMARY OF THE INVENTION

Therefore, in multi-gigabit/s (1 to 10 Gbps) transceivers, speed limitations make it impractical to implement this equalizer as a digital FIR or an analog continuous-time filter.

Conventional approaches to dealing with frequency dependent attenuation on transmission lines have been based on equalization, either in the transmitter or the receiver. For example, Tomlinson preceding is used in modems, and digital equalization in binary communication channels has been suggested in U.S. Pat. No. 4,374,426 to Burlage et al. However, such systems cannot scale to very high data rate binary or multilevel systems having bandwidths extending from near DC to greater than 100 MHz. Above 100 MHz, there is substantial attenuation on conventional transmission lines.

In accordance with the present invention, an equalizer includes plural samplers for sampling an incoming input data stream according to plural phases of a sampling clock, each sampler producing a data sample. Operating in the analog domain, a multi-tap finite impulse response (FIR) filter weights the data samples and combines the weighted data samples to produce a filtered data bit. The filtered data bits thus form an equalized output data stream.

In a particular embodiment, the analog FIR filter includes a first current source that produces a first current proportional to the product of the previous data sample and the weight associated with the previous data sample tap. For example, in an N-tap filter, where N>2, different weights may be associated with the N-1, N-2, etc. taps. Of course, where N=2, there is only one weight, associated with tap N-1. A second current source produces a second current which is proportional to an instance data sample. An adder circuit subtracts the second current from the first current to produce a third current, for example, by hard-wiring the current-carrying conductors. Finally, a converter circuit converts the third current to a voltage corresponding to the filtered data bit, for example, through passive or active resistors.

In at least one embodiment, the equalizer compensates for characteristics of a communications channel, such as low-pass characteritics. The channel may carry high-speed, e.g., multi-gigabit per second, traffic, and may be any type of communications channel, including, but not limited to, a cable, a circuit board trace or an optical fiber. Where the communications channel exhibits low-pass characteristics, the equalizer's FIR filter is a high-pass filter.

The present invention offers several advantages.

First, performing all of the filter function in the analog domain allows the equalizer to operate at multi-Gbps speeds using modest CMOS technologies at low complexity, and therefore requiring very small power and area.

Second, another method used successfully to combat ISI in multi-Gbps links is transmitter pre-emphasis, as described in William J. Dally and John Poulton, "Transmitter equalization for 4 Gb/s signaling," Hot Interconnects Symposium, August 1996 ("Dally"). However, one drawback of the transmit pre-emphasis is that it consumes part of the transmitter power for preshaping the output signal. If channel bandwidth is considerably lower than the data rate, pre-emphasis may require a large portion of the output driver power budget. See also, U.S. patent application Ser. No. 08/882,252, filed on Jun. 25, 1997. On the other hand, in a receiver equalizer, the extra filter taps consume very little power overhead.

From a signal integrity point of view, it is preferred to transmit signals with low-frequency contents or large rise/fall transition times. This is because high-frequency signals excite the high-frequency modes of the line due to the impedance discontinuities, and thus they require a better transmission medium. However, increasing the transition times of the signal reduces the effective data eye opening at the receiver, which can result in higher bit error rates (BER) in the system. Having an equalizer that acts as a high-pass filter, a receiver can sharpen the signal transitions of the received data, which has maximum allowable transition time (minimized high-frequency components), effectively increasing the data eye opening.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

The density and speed of modern VLSI technology can be applied to overcome the I/O bottleneck they have created by building sophisticated I/O circuitry that compensates for the characteristics of the physical interconnect and cancels dominant sources of timing and voltage noise. Such optimized I/O circuitry is capable of achieving I/O rates an order of magnitude higher than those commonly used today while operating at lower power levels.

A system embodying the invention can achieve a 4 Gbps signaling rate by controlling and compensating for characteristics of the transmission medium, by cancelling timing skew, and through careful management of time and voltage noise.

Figure 1:
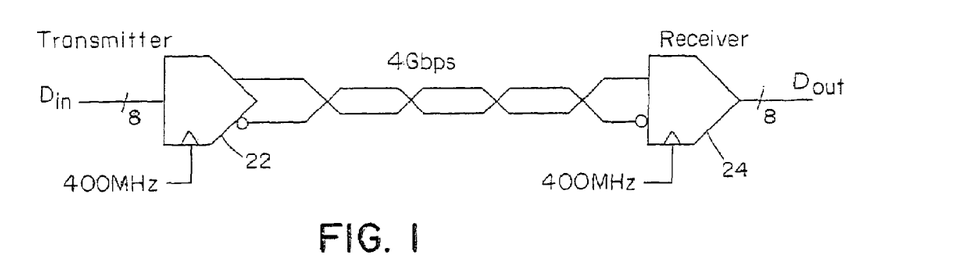
FIG. 1 illustrates a digital communication system embodying in the present invention.

FIG. 1 shows one channel of high-speed signaling system embodying the invention. A transmitter module 22 accepts 8-bit parallel data at 400 MHz. Each byte is coded into ten bits for band-limiting and forward error correction and transmitted across a single differential communications channel such as a transmission line, a cable, a circuit board trace or an optical fiber.

The lossy transmission line as well as package and connector parasitics attenuate and distort the received waveform, and it is further corrupted by noise coupled from adjacent lines and the power supply. The receiver 24 accepts this noisy, distorted signal and its own 400 MHz clock. The receiver generates 4 GHz timing signals aligned to the received data, samples the noisy signal and equalizes it in the analog domain, decodes the signal, and produces synchronous 8-bit data out.

The availability of 4 Gbps electrical signaling will enable the design of low-cost, high-bandwidth digital systems. The wide, slow buses around which many contemporary digital systems are organized can be replaced by point-to-point networks using a single, or at most a few, high-speed serial channels resulting in significant reduction in chip and module pinouts and in power dissipation. A network based on 400 MBytes/s serial channels, for example, has several times the bandwidth of a 133 MBytes/s PCI-bus that requires about 80 lines.

Also, depending on its topology, the network permits several simultaneous transfers to take place at full rate. A group of eight parallel channels would provide sufficient bandwidth (3.2 GBytes/s) for the CPU to memory connection of today's fastest processors. For modest distances (up to 30 m with 18 AWG wire), high-speed electrical signaling is an attractive alternative to optical communication in terms of cost, power, and board area for peripheral connection and building-sized local-area networks.

Frequency-dependent Attenuation Causes Intersymbol Interference

Skin-effect resistance and dielectric loss causes the attenuation of a conventional transmission line to increase with frequency. With a broadband signal, as typically used in digital systems, the superposition of unattenuated low-frequency signal components with attenuated high-frequency signal components causes intersymbol interference that degrades noise margins and reduces the maximum frequency at which the system can operate.

Figure 2A:
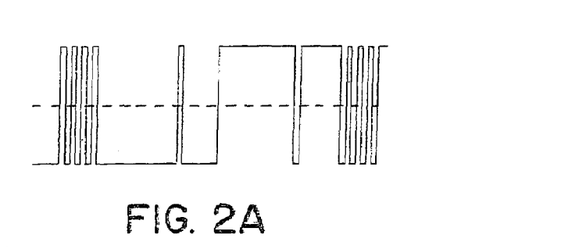
FIGS. 2A and 2B illustrate a sample binary pulse train and the resultant frequency dependent attenuation caused by a transmission line.
Figure 2B:
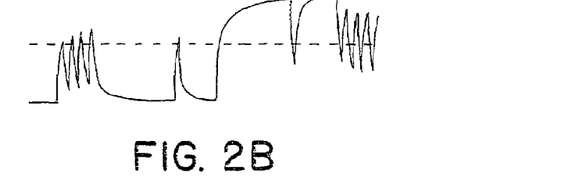
Figure 3A:
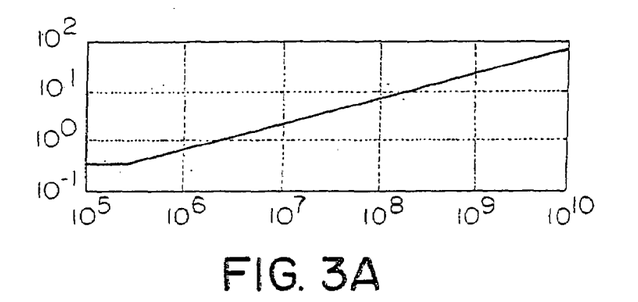
FIGS. 3A and 3B illustrate the resistance and attenuation curves for one meter of 30 AWG, 100 ohm twisted pair transmission line.
Figure 3B:
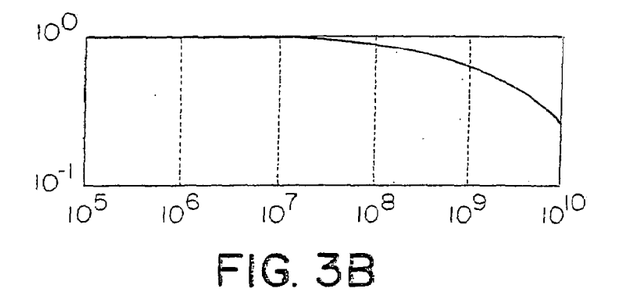
Figure 3C:
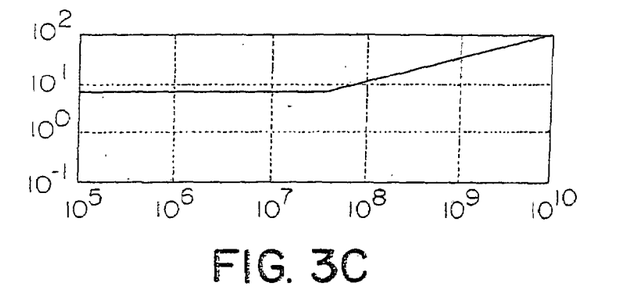
FIGS. 3C and 3D illustrate the resistance and attenuation curves for one meter of 5 mil 0.5 oz 50 ohm strip guide.
Figure 3D:
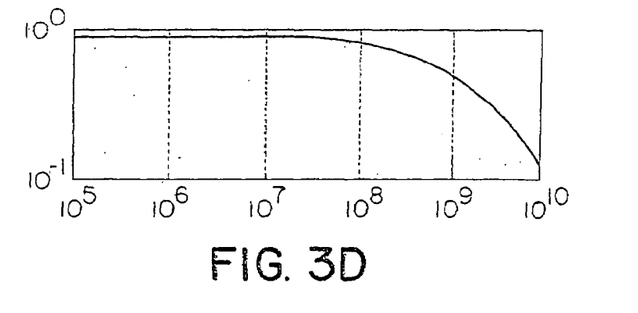

This effect is most pronounced in the case of a single 1 (0) in a field of 0s (1s) as illustrated in FIGS. 2A and B. The figures show a 4 Gb/s signal (FIG. 2A) and the simulated result of passing this signal across 3 m of 24 AWG twisted pair (FIG. 2B). The highest frequency of interest (2 GHz) is attenuated by −7.6 dB (42%). The unattenuated low-frequency component of the signal causes the isolated high-frequency pulse to barely reach the midpoint of the signal swing, providing almost no eye opening in a differential system and very little probability of correct detection.

The problem here is not the magnitude of the attenuation, but rather the interference caused by the frequency-dependent nature of the attenuation. The high-frequency pulse has sufficient amplitude at the receiver for proper detection. It is the offset of the pulse from the receiver threshold by low-frequency interference that causes the problem. The use of a receiver equalizer to emphasize the high-frequency components of the signal eliminates this problem.

First, we characterize the nature of this attenuation in more detail.

FIGS. 3A–D show the resistance per meter and the attenuation per meter as a function of frequency for a 30 AWG (d=128 mm) twisted pair with a differential impedance of 100 ohms (FIGS. 3A and 3B) and for a 5 mil (d=125 mm) half-ounce (0.7 mil thick) 50 Ohms (FIGS. 3C and 3D) stripguide. For the 30 AWG pair, the skin effect begins increasing resistance at 267 KHz and results in an attenuation to 56% of the original magnitude (−5 dB) per meter of cable at our operating frequency of 2 GHz corresponding to a bit rate of 4 Gb/s. Skin effect does not begin to effect the 5 mil PC trace until 43 MHz because of its thin vertical dimension. The high DC resistance (6.8 ohms/m) of this line gives it a DC attenuation of 88% (−1.2 dB). Above 70 MHz, the attenuation rolls off rapidly, reaching 40% (−8 dB) at 2 GHz. The important parameter, however, is the difference between the DC and high-frequency attenuation which is 45% (−6.8 dB).

Figure 4A:
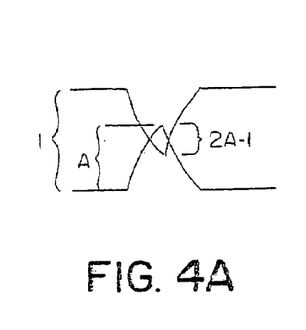
FIG. 4A illustrates respective plus and minus signals in a differential system and the reduced data eye due to attenuation.
Figure 4B:
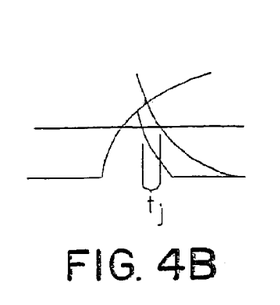
FIG. 4B illustrates trailing edge jitter.
Figure 4C:
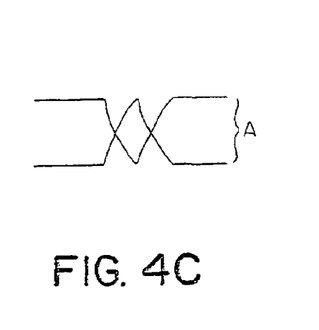
FIG. 4C illustrates the data eye with equalization.

The effect of frequency dependent attenuation is graphically illustrated in the eye-diagrams of FIGS. 4A–C. As shown in the waveform in FIG. 4A, without equalization, a high-frequency attenuation factor of A reduces the height of the eye opening to 2A-1 with the eye completely disappearing at A≦0.5. This height is the amount of effective signal swing available to tolerate other noise sources such as receiver offset, receiver sensitivity, crosstalk, reflections of previous bits, and coupled supply noise. Because the waveforms cross the receiver threshold offset from the center of the signal swing, the width of the eye is also reduced. As illustrated in FIG. 4B, the leading edge of the attenuated pulse crosses the threshold at the normal time. The trailing edge, however, is advanced by $t_j$. This data-dependent jitter causes greater sensitivity to skew and jitter in the signal or sampling clock and may introduce noise into the timing loop.

The waveform of FIG. 4C illustrates the situation when the signal is equalized by attenuating the DC and low frequency components so that all components are attenuated by a factor of A. Here the height of the eye opening is A, considerably larger than 2A-1, especially for large attenuations. Also, because the waveforms cross at the midpoint of their swing, the width of the eye is a full bit-cell giving better tolerance of timing skew and jitter.

Post-emphasizing Signal Transitions Equalizes Line Attenuation

Equalization eliminates the problem of frequency-dependent attenuation by filtering the transmitted or received waveform so the concatenation of the transmission line and the equalizing filter gives a flat frequency response. With equalization, an isolated 1 (0) in a field of 0s (1s) crosses the receiver threshold at the midpoint of its swing, as shown in FIG. 4C, rather than being offset by an unattenuated DC component, as shown in FIG. 4A. Narrow-band voice, video, and data modems have long used equalization to compensate for the linear portion of the line characteristics (Lee, Edward A., and Messerschmitt, David G., Digital Communication, Second Edition, Kluwer, 1994). Dally first used pre-emphasis equalization in broadband signaling with a wide bandwidth (i.e., greater than 100 MHz) over short distances.

In an embodiment of the present invention, the line is equalized using an analog FIR filter built at the receiver.

Circuit Implementations

Figure 5:
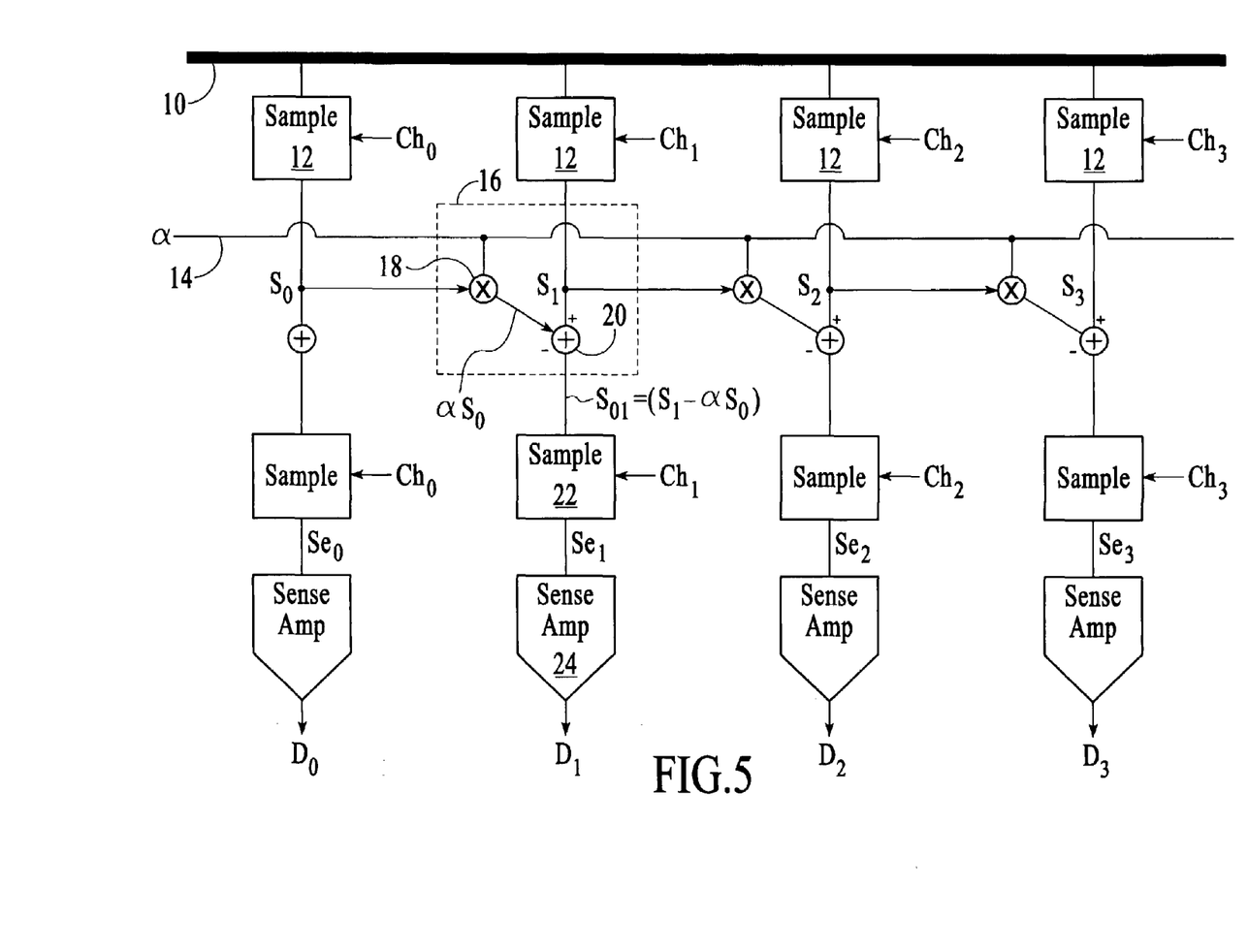
FIG. 5 is a simplified schematic of an embodiment of the receiver equalizer of the present invention.
Figure 6:
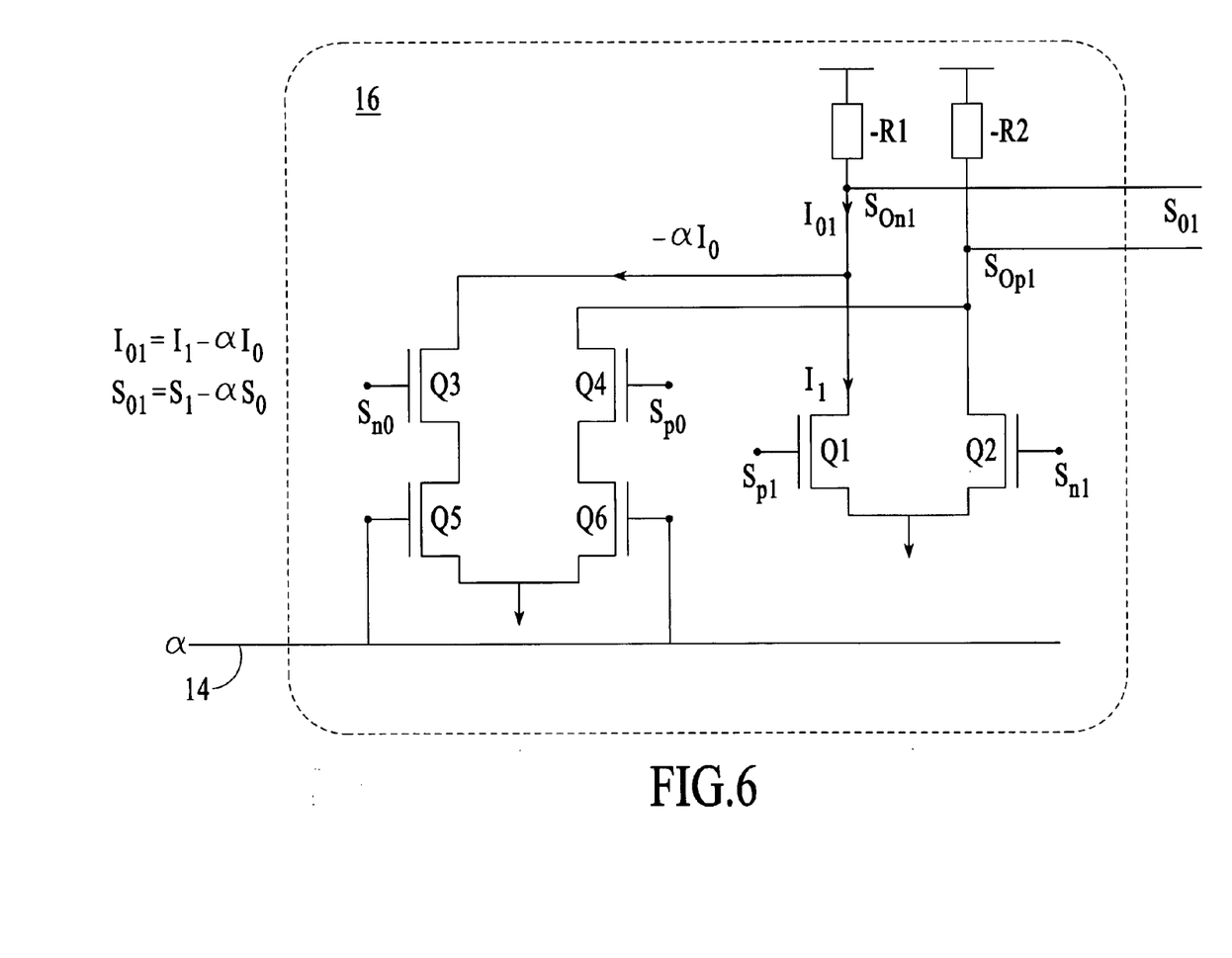
FIG. 6 is a schematic of the weighting and adder functions of FIG. 5.

Preferred implementations of the invention include analog finite input response (FIR) filters, and FIGS. 5 and 6 illustrate one such implementation.

The present invention comprises an equalizer that compensates for the low-pass characteristics of a communication channel, such as cable, board traces, etc., in a multi-Gbps link. A receiver uses this equalizer to cancel intersymbol interference (ISI) caused by the channel.

The equalizer uses an analog FIR architecture that allows very fast processing speeds. Filtering is performed in the analog domain directly on the analog sampled and held data values before they are digitized and used by other blocks.

To implement an N-tap analog FIR filter according to the present invention, N analog samples of a received data stream are sampled by the receiver at least once every symbol period. In other words, for each received data symbol, its value and the previous N-1 symbol values are sampled and held. The N samples are then modulated by appropriate constant values, i.e., filter tap weights, and added or subtracted in the analog domain. This capability allows the implementation of the FIR function as follows:

$$S_{eq}(n) = S_n \mp \alpha S_{n-1} \mp \beta S_{n-2}$$ (Eq. 1)

where $S_{eq}(n)$ is the filter output corresponding to sample n; $S_n$, $S_{n-1}$, $S_{n-2}$, etc. are the sampled analog data values at instances n, n-1, n-2, etc.; and $\alpha$, $\beta$, etc. are the associated filter tap weights.

In the case of oversampling, for example for purposes such as clock recovery, subsymbol-spaced FIR filtering can also be implemented using this technique, which allows frequency compensation for a larger frequency range.

As an example, FIG. 5 shows the half-circuit architecture of a differential demultiplexing receiver using a 2-tap symbol-space FIR equalizer. Using multiple clock phases, the receiver switch samplers provide the required analog voltage samples from present and previous bit times, which are next converted into proportional currents based on the filter tap weight. By holding the present and former differential current samples, the equalizer can subtract the weighted value of the former sample $S_{n-1}$ from the present sample $S_n$.

Specifically, in FIG. 5, the differential input 10 of the received data stream is sampled by samplers 12, each clocked by a separate phase of a sampling clock $Ck_0$, $Ck_1$, etc.

As an example, the determination of the value of data bit $D_1$ is discussed. $S_1$ is the corresponding sampled value, while $S_0$ corresponds to the previous sample. The output of the previous sample $S_0$ is multiplied by the tap weight $\alpha$ by multiplier 18. This product $\alpha S_0$ is then subtracted from sample $S_1$ by adder 20. The difference $S_{eq} = S_{01} = (S_1 - \alpha S_0)$ is then held by sampler 22 and sensed by a sense amp 24.

FIG. 6 illustrates a particular circuit which performs the operation of the multiplier 18 and adder 20 of FIG. 5, collectively shown in box 16. The filtering function is performed by current summing two differential values with opposite polarity. These are $S_{n0}$ and $S_{p0}$, the differential values corresponding to $S_0$ of FIG. 5, and $S_{n1}$ and $S_{p1}$, the differential values corresponding to $S_1$ of FIG. 5. The currents shown in FIG. 5 are due only to the signal inputs. DC bias currents are not shown, but are well-known within the art.

Transistors Q1 and Q2 form a differential amplifier, having as input the differential signal $S_1$, comprising $S_{p1}$ and $S_{n1}$. Looking at just one side of the amplifier, the current resulting from input signal $S_{p1}$ is $I_1$.

A voltage related to the tap weight $\alpha$ is applied to the previous sample $S_0$ by the dual input differential amplifier comprising transistors Q3–Q6. Transistors Q5 and Q6 operate in the triode region, acting like resistors to scale the output current of the circuit. Again, looking at just one half of this circuit, the previous sample differential signal $S_{n0}$ is applied to transistor Q3, while the weight a is applied to transistor Q5, operating in its linear region as a resistor. The result is the weighted current $-\alpha I_0$, where $-I_0$ is the current that would result for a weight of $\alpha=1$.

By hard-wiring together the n-side of one differential pair with the p-side of the other differential pair, i.e., by connecting the output of transistor Q3 with the output of transistor Q1, the weighed current $\alpha I_0$ is subtracted from the current $I_1$, yielding the difference $I_{01} = I_1 - \alpha I_0$. Drawn through a passive or active resistor 36, current $I_{01}$ is converted to voltage $S_{0n1}$, through passive or active resistor R1 to form one half of the differential output $S_0$.

The other half of the output, $S_{0p1}$, is similarly formed by the other sides of each differential pair and resistor R2.

This technique has been successfully reduced to practice in a transceiver chip using 0.3 um CMOS technology. This equalizer shows successful results in the link response at 6 Gb/s, by improving the eye diagram width by 20%. See Ramin Farjad, et al., "A 0.3 um CMOS 8-Gbps 4-PAM Serial Link Transceiver," IEEE JSSC, March 2000.

The value of the weight a depends on the type of transmission medium. It should always be below unity, and typically a reasonable value is between 0.1 and 0.7.

While this invention has been particularly shown and described with references to preferred embodiments thereof, it will be understood by those skilled in the art that various changes in form and details may be made therein without departing from the scope of the invention encompassed by the appended claims.

In particular, although a 2-tap filter appears to be sufficient, the present invention extends to N-tap filters where N can be any number.

What is claimed is:

1. A receiver equalizer, comprising:
samplers for sampling an incoming input data stream according to plural phases of a sampling clock, each sampler producing a demultiplexed data sample that changes at a slower rate than the incoming signal; and
a plurality of multi-tap finite impulse response (FIR) filters, where each FIR filter, in an analog domain, for each demultiplexed data sample, weights said demultiplexed data sample and at least one previous demultiplexed data sample, and combines said weighted data samples to produce an equalized demultiplexed data value, wherein each FIR filter includes at least one scaler, wherein each of the scalers has dedicated tap weight.

2. The equalizer of claim 1, wherein each of the plurality of multi-tap FIR filters comprises:
a first current source that produces a first current which is proportional to a product of a previous data sample and a weight associated with said previous data sample tap;
a second current source that produces a second current which is proportional to an instance data sample;
an adder circuit which subtracts the second current from the first current to produce a third current; and
a converter circuit which converts the third current to a voltage corresponding to the equalized data bit.

3. The equalizer of claim 1, wherein the equalizer compensates for characteristics of a communications channel.

4. The equalizer of claim 3, wherein the communications channel is a multi-gigabit per second link.

5. The equalizer of claim 3, wherein the communications channel is a cable.

6. The equalizer of claim 3, wherein the communications channel is a circuit board trace.

7. The equalizer of claim 3, wherein the communications channel is an optical fiber.

8. The equalizer of claim 3, wherein the communications channel has low-pass characteristics.

9. The equalizer of claim 1, wherein the FIR filter is a high-pass filter.

10. The equalizer of claim 1, further comprising:
second samplers for sampling and holding the equalized data bit values; and
sense amplifiers for converting the sampled equalized data bit values to digital values.

11. A method for equalizing an incoming input data stream, comprising:
sampling the input data stream according to plural phases of a sampling clock to produce demultiplexed data samples changing at a slower rate than the incoming signal; and
filtering the slow changing demultiplexed data samples with a plurality of analog multi-tap finite impulse response (FIR) filters, having dedicated tap weights, to produce demultiplexed equalized data values.

12. The method of claim 11, wherein filtering comprises:
in an analog domain, weighting the data samples; and
combining the weighted data samples to produce an equalized data bit.

13. The method of claim 12, wherein the FIR filter is a high-pass filter.

14. The method of claim 11, further comprising:
sampling and holding the equalized data bit values; and
converting the sampled equalized data bit values to digital values.

15. A receiver equalizer, comprising:
means for sampling the input data stream according to plural phases of a sampling clock to produce demultiplexed data samples changing at a lower rate than the incoming signal; and
means for filtering the slower rate demultiplexed data samples with a plurality of an analog multi-tap finite impulse response (FIR) filters to produce demultiplexed equalized data values;
means for sampling and holding the demultiplexed equalized data bit values; and
means for converting the sampled equalized data bit values to digital values.

16. A multi-tap analog finite impulse response filter, comprising:
at least one combined voltage-current converter and scaler that produces a first current from an input voltage which is proportional to a product of a previous data sample voltage and a weight associated with said previous data sample tap;
a voltage-current converter that produces a second current which is proportional to an instance data sample voltage;
an adder circuit which subtracts the second current from the first current to produce a third current; and
a converter circuit which converts the third current to a voltage corresponding to the equalized data voltage.

17. The multi-tap analog FIR filter of claim 16, where the combined voltage-current converter and scaler is implemented by modulating the relative strength for source current) of the voltage-current converter according to the weight associated with its input data sample.

18. The combined-voltage current converter and scaler of claim 17, where conversion and scaling is performed by an open-loop circuit.

19. A multi-tap analog finite impulse response filter method, comprising:
producing at least a first current from an input voltage which is proportional to a product of a previous data sample voltage and a weight associated with said previous data sample tap;
producing a second current which is proportional to an instance data sample voltage;
subtracting the second current from the first current to produce a third current; and
converting the third current to a voltage corresponding to the filtered data bit.

20. The multi-tap analog FIR filter of claim 19, where output product current is produced by modulating a current, which is proportional to the data sample voltage, according to the weights associated with that data sample tap.

21. A multi-tap analog finite impulse response filter, comprising:
means for producing at least a first current from an input voltage which is proportional to a product of a previous data sample voltage and a weight associated with said previous data sample tap;

means for producing a second current which is proportional to an instance data sample voltage;
means for subtracting the second current from the first current to produce a third current; and
means for converting the third current to a voltage corresponding to the filtered data bit.

* * * * *